(12) United States Patent
Maloney

(10) Patent No.: US 10,283,943 B2
(45) Date of Patent: May 7, 2019

(54) THERMALLY CONDUCTIVE RING ASSEMBLIES SUITABLE FOR LOAD CENTERS

(71) Applicant: Eaton Intelligent Power Limited, Dublin (IE)

(72) Inventor: James Gerard Maloney, Industry, PA (US)

(73) Assignee: Eaton Intelligent Power Limited, Dublin (IE)

( * ) Notice: Subject to any disclaimer, the term of this patent is extended or adjusted under 35 U.S.C. 154(b) by 0 days.

(21) Appl. No.: 16/167,868

(22) Filed: Oct. 23, 2018

(65) Prior Publication Data

US 2019/0058309 A1 Feb. 21, 2019

Related U.S. Application Data

(62) Division of application No. 15/724,355, filed on Oct. 4, 2017, now Pat. No. 10,141,722.

(60) Provisional application No. 62/436,261, filed on Dec. 19, 2016.

(51) Int. Cl.

| | |
|---|---|
| *H02B 1/21* | (2006.01) |
| *H01H 1/38* | (2006.01) |
| *H02B 1/056* | (2006.01) |
| *H02G 3/14* | (2006.01) |
| *F28F 21/08* | (2006.01) |
| *F28F 21/04* | (2006.01) |
| *H02B 1/06* | (2006.01) |
| *H01H 71/00* | (2006.01) |
| *H05K 1/02* | (2006.01) |
| *H02B 1/56* | (2006.01) |

(52) U.S. Cl.
CPC ............ *H02B 1/21* (2013.01); *F28F 21/04* (2013.01); *F28F 21/084* (2013.01); *F28F 21/085* (2013.01); *H01H 1/38* (2013.01); *H02B 1/056* (2013.01); *H02B 1/06* (2013.01); *H02G 3/14* (2013.01); *H01H 2071/006* (2013.01); *H02B 1/56* (2013.01); *H05K 1/0263* (2013.01); *H05K 2201/10272* (2013.01)

(58) Field of Classification Search
CPC ........................................................ H02B 1/21
USPC ........................................ 361/678, 641–656
See application file for complete search history.

(56) References Cited

U.S. PATENT DOCUMENTS

| | | | | |
|---|---|---|---|---|
| 2,738,445 A | * | 3/1956 | Hammerly | H02B 1/056 174/99 B |
| 4,024,441 A | | 5/1977 | Coyle et al. | |
| 4,251,851 A | * | 2/1981 | Diersing | H02B 1/056 361/634 |
| 4,472,761 A | * | 9/1984 | Koslosky | H02B 1/21 361/638 |

(Continued)

*Primary Examiner* — Mukundbhai G Patel
(74) *Attorney, Agent, or Firm* — Myers Bigel, P.A.

(57) ABSTRACT

Thermally conductive assemblies that provide a heat conduction path include at least one thermally conductive inner member with longitudinally opposing first and second ends and an open center channel and an outer member surrounding the at least one thermally conductive inner member. The outer member is sufficiently flexible to expand outward in response to an outward force applied by the at least one thermally conductive inner member. The at least one inner member can be a plurality of cooperating inner members that have inner surfaces that align to form an inner perimeter surrounding the open center channel.

13 Claims, 6 Drawing Sheets

(56) References Cited

U.S. PATENT DOCUMENTS

| | | |
|---|---|---|
| 5,072,071 A | 12/1991 | Cassity et al. |
| 5,859,764 A | 1/1999 | Davis et al. |
| 6,194,983 B1 | 2/2001 | Bogdon et al. |
| 7,186,933 B2 | 3/2007 | Turner |
| 7,345,881 B2 * | 3/2008 | Colbert ............... H01L 23/4006 165/185 |
| 10,034,403 B1 | 7/2018 | Flannery et al. |
| 2003/0075784 A1 | 4/2003 | Nakase et al. |
| 2005/0082051 A1 * | 4/2005 | Hashimoto ............. F16L 9/006 165/184 |
| 2008/0019102 A1 | 1/2008 | Yurko |
| 2012/0099279 A1 | 4/2012 | Greenwood et al. |
| 2013/0077210 A1 | 3/2013 | Morris |
| 2014/0185195 A1 | 7/2014 | Samuelson |
| 2017/0133789 A1 * | 5/2017 | Haegele ............. H01R 13/6275 |
| 2017/0363371 A1 | 12/2017 | David |

* cited by examiner

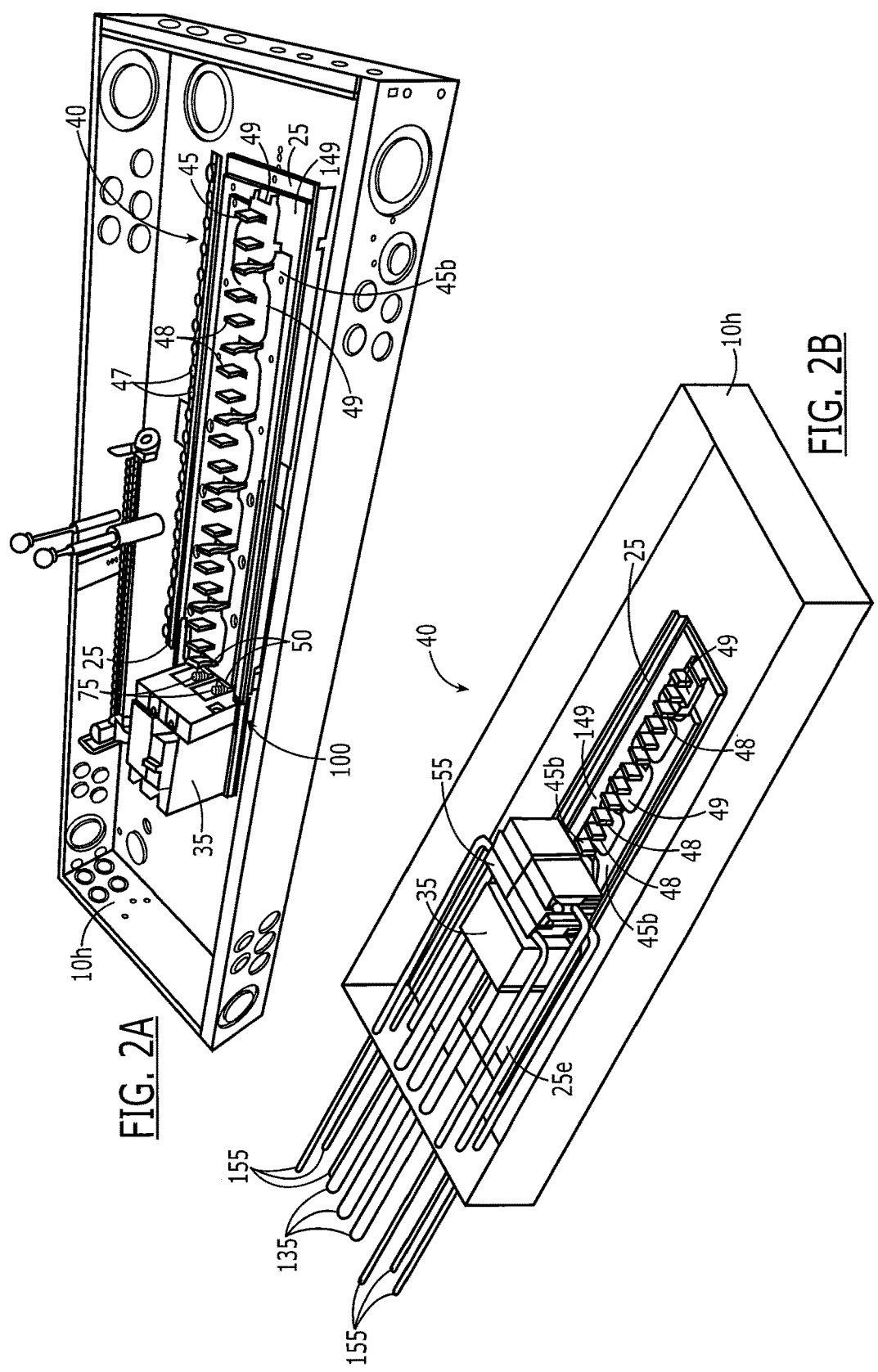

THERMALLY CONDUCTIVE RING ASSEMBLIES SUITABLE FOR LOAD CENTERS

RELATED APPLICATIONS

This application is a divisional application of U.S. patent application Ser. No. 15/724,355 filed Oct. 4, 2017, which claims the benefit of and priority to U.S. Provisional Application Ser. No. 62/436,261, filed Dec. 19, 2016, the contents of which are hereby incorporated by reference as if recited in full herein.

FIELD OF THE INVENTION

The present disclosure relates to thermally conductive connectors which may be particularly suitable for electrical devices such as distribution load centers.

BACKGROUND OF THE INVENTION

Electrical load centers are well known. Electrical load centers include electrical busses comprise conductors permitting electrical current to be carried throughout the electrical load center. Electrical busses may contain features permitting attachment of fuses, relays, switches, wires, breakers, and other electrical elements. Load centers may contain one or more electrical busses in close proximity to one another, and insulating material or insulation is used to avoid an arcing or shorting event occurring between the busses. Busses must are electrically insulated from each other to avoid a phase-to-phase short circuit. Busses are also electrically insulated from the electrical load center enclosure to avoid a phase-to-ground short circuit. Some load centers also include branch circuit breakers connected to the electrical busses at specific points within the load centers. The location, orientation, and spacing of the bus elements and insulation elements within the load are arranged so as to prevent an arcing, overcurrent, or short circuit event once the busses are placed under load.

In the past, thermally conductive greases, adhesives and Room Temperature Vulcanization silicone (RTV's) have been used to bridge air gaps to facilitate suitable heat conduction.

SUMMARY OF EMBODIMENTS OF THE INVENTION

Embodiments of the present invention provide positive constant contact interfaces for connections reducing or eliminating the use of conductive greases, adhesives and RTVs for facilitating heat conduction between devices, such as, in some embodiments, from a plug and/or collar to a metal housing or back pan.

Embodiments of the invention are directed to thermally conductive assemblies that include at least one inner member with longitudinally opposing first and second ends and an open channel. The at least one inner member is thermally conductive. The assemblies also include an outer member surrounding the at least one inner member. The outer member is sufficiently flexible to expand outward in response to an outward force applied by the at least one thermally conductive inner member.

The at least one inner member can be a plurality of cooperating inner members that have inner surfaces that align to form an inner perimeter surrounding the open center channel.

The at least one inner member can be at least two cooperating inner members. The at least two cooperating inner members can be arcuate.

The outer member can include a lip that resides over a first end of the at least one thermally conductive inner member.

The outer member can include or be a ring that is radially expandable and comprises one or more of rubber, a polymer and/or an elastomer.

The at least two cooperating inner members can be formed of boron nitride.

The outer member can be a flexible ring. The at least one inner member can be a plurality of inner members, each with a wall thickness greater than a wall thickness of the outer member. The outer member can radially expand to allow the inner members to move from a first configuration where neighboring inner members abut to a second configuration where neighboring inner members are spaced apart while providing a compressive inwardly extending force against the inner members.

The at least one inner member can be a plurality of aligned inner members with inner and outer arcuate shapes that form a circular inner perimeter surrounding the open (optionally center) channel and a circular outer perimeter abutting the outer member.

Embodiments are directed to load centers that include an enclosure having an interior compartment; a back pan in the interior compartment; one or more bus bars in the interior compartment; a circuit breaker comprising a housing in the interior compartment electrically engaged with the one or more bus bars; a conductive member attached to the circuit breaker; and a thermally conductive assembly. The thermally conductive assembly includes at least one inner member with longitudinally opposing first and second ends and an open channel holding the conductive member attached to the circuit breaker therein with the first end facing the circuit breaker and at least one outer member surrounding the at least one conductive inner member. The at least one inner member is thermally conductive.

The at least one inner member can be a plurality of cooperating inner members that have inner surfaces that align to form an inner perimeter surrounding the open (optionally center) channel. The outer member can be sufficiently flexible to be able to radially expand and surrounds the plurality of inner members.

The outer member can include a lip that resides over the first end of the at least one inner member.

The outer member can be a ring that is radially expandable and comprises one or more of rubber, a polymeric and/or an elastomeric material.

The conductive member attached to the circuit breaker can include or be an external plug that comprises copper or aluminum. The at least one inner member can be formed of boron nitride.

The conductive member attached to the circuit breaker can be or include a plug that resides in the open channel above the back pan and above the second end of the at least one inner member.

The at least one inner member can be a plurality of inner members, each with a wall thickness greater than a wall thickness of the outer member. The outer member can surround the inner members. The outer member can be flexible and can radially expand while providing a compressive inwardly extending force against the inner members.

The at least one inner member can be a plurality of aligned inner members with inner and outer arcuate shapes that form a circular inner perimeter surrounding the open channel and a circular outer perimeter abutting the outer member.

The circuit breaker can have a housing with an open rectangular channel on an end thereof that holds a collar. The conductive member attached to the circuit breaker can be or include a plug extends below the collar adjacent but above the back pan. The at least one inner member can be a plurality of inner members, each having constant direct abutting contact with the back pan.

Other embodiments are directed to methods of installing a heat conduction device to a circuit breaker. The methods include: providing a circuit breaker; attaching a thermally conductive ring assembly to a conductive member extending from the circuit breaker, the ring assembly comprising an outer flexible ring surrounding a plurality of cooperating inner members that are aligned to form a perimeter about an open channel; and providing a heat conduction path between the circuit breaker and a spaced apart device through the thermally conductive ring assembly.

The conductive member can include a plug that comprises copper and/or aluminum. Prior to the attaching step, neighboring inner members of the cooperating inner members can abut each other. The attaching can include press fitting the plug into the open channel to force the neighboring inner members to separate while also radially expanding the outer member.

Optionally, the inner members are formed of boron nitride.

Optionally, the circuit breaker is held in a load center and the heat conduction path is between the circuit breaker and a back pan and/or metal panel as the other device.

Further features, advantages and details of the present invention will be appreciated by those of ordinary skill in the art from a reading of the figures and the detailed description of the preferred embodiments that follow, such description being merely illustrative of the present invention.

It is noted that aspects of the invention described with respect to one embodiment, may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

BRIEF DESCRIPTION OF THE DRAWINGS

FIG. 2A is a top, side perspective view of a back pan assembly in an enclosure of a load center according to embodiments of the present invention.

FIG. 2B is a top, side perspective schematic illustration of a load center according to embodiments of the present invention.

DETAILED DESCRIPTION OF EMBODIMENTS OF THE INVENTION

Figure 1A:
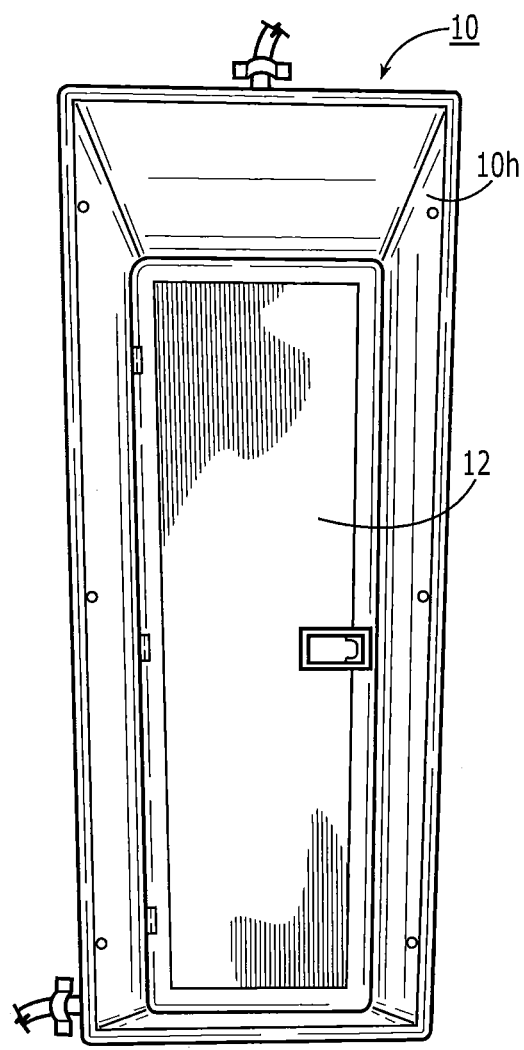
FIG. 1A is a front view of an exemplary load center.

The present invention now will be described more fully hereinafter with reference to the accompanying drawings, in which illustrative embodiments of the invention are shown. Like numbers refer to like elements and different embodiments of like elements can be designated using a different number of superscript indicator apostrophes (e.g., 10, 10', 10", 10'''). The terms "FIG." and "FIG." may be used interchangeably with the word "Figure" as abbreviations thereof in the specification and drawings. In the figures, certain layers, components or features may be exaggerated for clarity, and broken lines illustrate optional features or operations unless specified otherwise.

In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90° or at other orientations) and the spatially relative descriptors used herein interpreted accordingly.

The term "about" refers to numbers in a range of +/−20% of the noted value.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Embodiments of the invention are particularly suitable for electrical devices such as load centers. The terms "load center" and "electrical distribution load center" refer to the collective components of an electrical distribution system and its respective housing that supplies electrical power to one or more subsidiary circuits. The terms "bus," "bus element," "electrical distribution bus," or "bus bar" refers to components in an electrical distribution system that conducts electricity within the load center. However, the thermally conductive assemblies may also be useful for other devices such as devices comprising circuit breakers, for example.

Figure 1B:
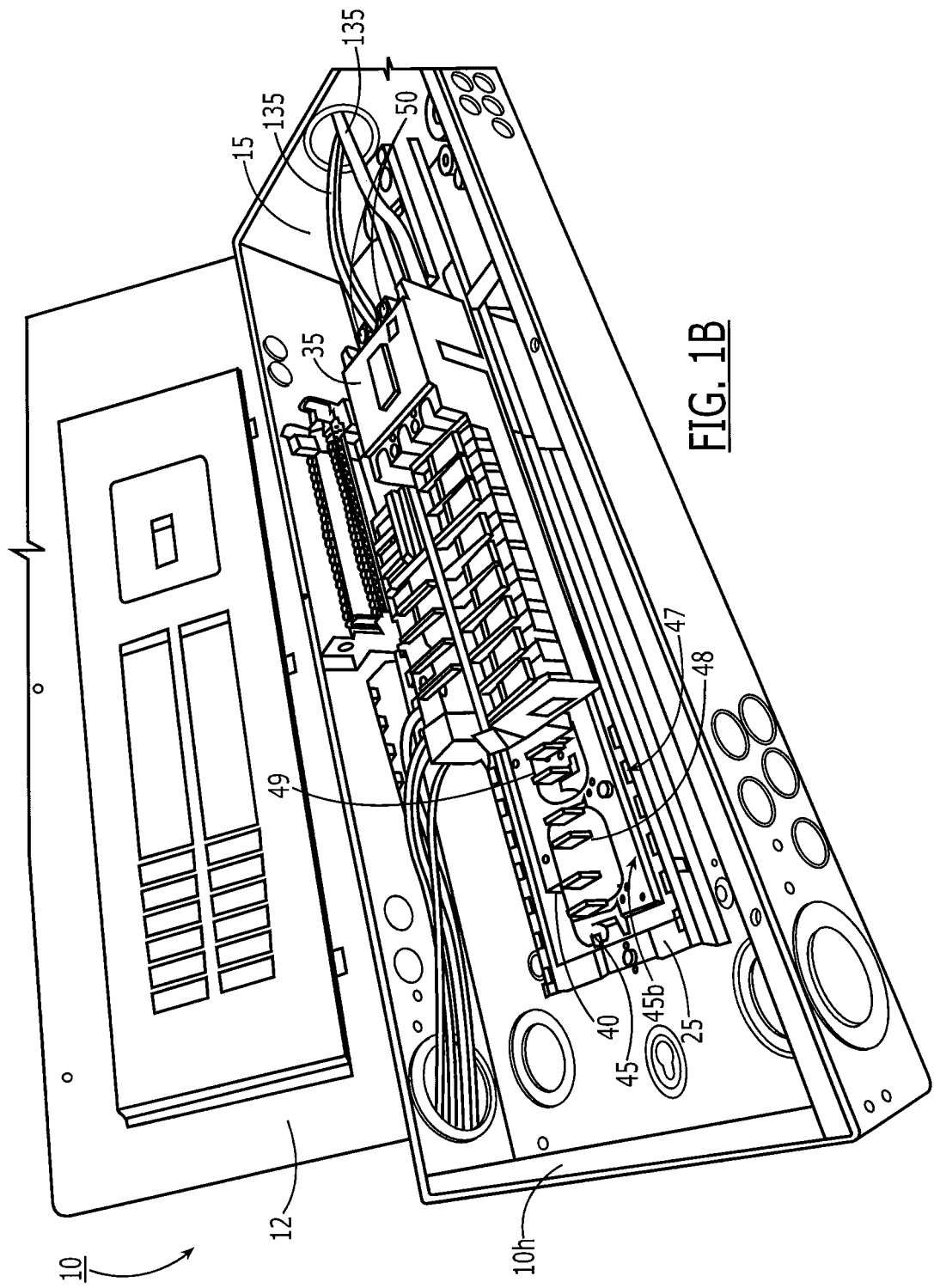
FIG. 1B is a side perspective view of the load center shown in FIG. 1A in an open position according to embodiments of the present invention.

Referring now to FIGS. 1A and 1B, an exemplary load center 10 is shown. The load center 10 includes a housing 10h (also known as an "enclosure") and a panel or cover 12. The panel 12 can be removed or opened to reveal an interior compartment 15 of the housing 10h. As shown, the housing 10h holds a back pan 25, a main breaker 35 and an interior assembly 40 with a bus 45 one or more bus bars 45b. The interior assembly 40 can be either detachably or permanently fastened to the back pan 25. The interior assembly 40 (also sometimes just referred to as "the interior") can refer to the internal components of the load center 10 including the insulating barrier, i.e., sheet, film or layer (which can optionally comprise mylar), the bus 45, the retaining clips (the hook part) and the stabs (the bent-up parts) and the like. The interior assembly 40 can include or be connected to the main breaker 35. The main breaker 35 may be connected to an external power supply via collars or lugs 50 that connect cables/power cords 135.

Referring to FIGS. 1B, 2A and 2B, the one or more bus bars 45b may be a plurality of bus bars 45b and may have substantially flat portions that extend longitudinally within, and lie in a plane parallel to a trough formed by the back pan 25. The bus bars 45b may contain stabs 48, such as branch circuit breaker stabs, that can be exposed within an insulation element so as to conduct electricity to branch circuit breakers 55 (FIG. 2B), when connected. The stabs 48 may extend upwardly to contact desired components such as a branch circuit breaker 55 (FIG. 2B) when connected.

The one or more bus bars 45b can be designed to electrically couple to the main breaker 35 as well any branch circuit breakers 55 (FIG. 2B). The one or more bus bars 45b can remain electrically insulated from other electrically conducting elements thus avoiding the occurrence of a shorting event.

Referring to FIG. 2B, the interior assembly 40 may comprise either electrically conducting or electrically insulating (i.e., non-electrically conducting) material adjacent the back pan 25. In some embodiments, an electrically insulating barrier 149, such as a polyester sheet or film which may comprise a mylar or BoPET (biaxially-oriented polyethylene terephthalate) sheet or film, may be provided under and/or on the substantially flat surfaces of the bus bars 45b to electrically insulate the one or more bus bars 45b from other conducting elements, such as the back pan 25, if the back pan 25 is made of a conductive material such as metal.

In some embodiments, the one or more bus bars 45b can maintain electrical insulation from other conducting elements based only on physical separation from the other conducting elements without requiring electrically insulating material.

In some embodiments, if the back pan 25 comprises an electrically insulating material such as a ceramic, polymer and/or plastic, the bus bars 45b do not need to be physically separated from the back pan 25.

In some embodiments, the interior assembly 40 can include retainer clips 47 and insulators 49 as also shown in FIGS. 1B, 2A and 2B and the back pan 25 can have an extension 25e that extends beyond the primary circuit breaker housing 35h on a side away from the branch breaker 55.

In some particular embodiments, the main circuit breaker 35 can be a 200A, three phase breaker attached to three wires or cables 135, which may be 160A per cable/cord and may have a diameter of about 0.56 inches. The branch circuit breaker 55 can have a lower amperage rating and smaller diameter wires/cables 155, such as 80A/phase and may have a diameter of about 0.40 inches.

Figure 3:
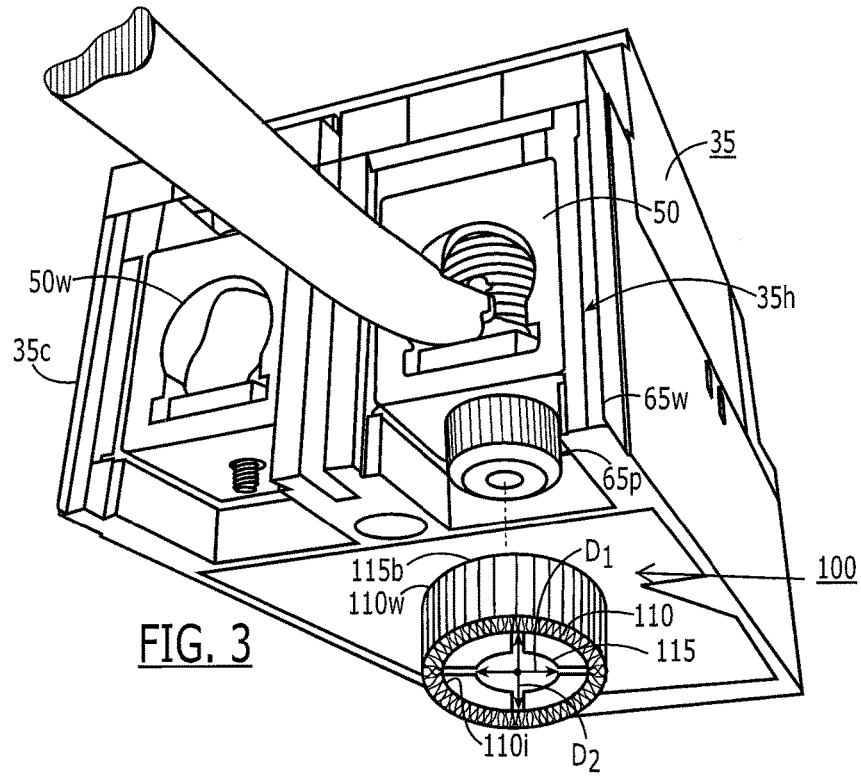
FIG. 3 is an enlarged end view of a main circuit breaker with a flexible thermally conductive assembly according to embodiments of the present invention.

Referring now to FIGS. 3-6, the load center 10 can comprise a thermally conductive assembly 100 that receives a thermally (and typically electrically) conductive member 65 such as a plug 65p extending out from the housing 35h of the primary circuit breaker 35. The member 65 or plug 65p can have any suitable shape and is sized and configured so that at least one end portion can extend into the open channel 115c of the thermally conductive assembly 100. As shown in FIG. 3, the conductive member 65 comprises or is only a plug 65p that can extend out of the circuit breaker 35 attached to a metallic collar 50 (the term "collar" is interchangeably referred to herein as a "lug" or "fitting") that can connect a line side and/or load side cable, shown as a line side cable 135. The collar 50 may be aluminum as is conventional or any other suitable material. The collar 50 can have a window 50w and a threaded member 52. The circuit breaker housing 35h can have an end with a rectangular channel 35c that holds the collar 50, typically two collars 50 side by side.

The main circuit breaker 35 can be an Arc Fault Circuit Interrupter (AFCI) and/or Ground Fault Circuit Interrupter (GFCI) which are among a variety of overcurrent protection devices used for circuit protection and isolation. AFCIs reduce fire hazards in electrical circuits by reducing the effects of high current arcing faults as well as detecting persistent low-current arcing faults. GFCIs reduce the potential of electrical shock. Both branch feeder and combination AFCIs provide conventional thermal and magnetic overcurrent protection. Both can also provide high current or "parallel" arcing fault detection and fire mitigation for installed wiring and connected cords. National Electrical Code (NEC) revisions have increased the requirement for sections of the home that require Arc Fault or Ground Fault protection. The circuit breaker can be a Type BR or CH AFCI or GFCI breaker.

The member 65, optionally including or being a plug 65p, can comprise one or more of copper, a copper alloy, aluminum, aluminum alloy or other suitably thermally conductive (and optionally also electrically conductive) material. The member 65, i.e., plug 65p, can have increased electrical and thermal conductivity relative to the at least one inner member 115.

As shown in FIGS. 3, 4, 5 and 7, the thermally conductive assembly 100 can include an outer member 110 that cooperates with at least one inner member 115 and can provide a positive constant contact interface between the plug 65p on a first end portion 115t and the back pan 25 with the longitudinally opposing second end 115b for conduction of heat that does not require thermally conductive greases, adhesives or RTVs (Room Temperature Vulcanization silicone) to bridge air gaps.

Figures 4, 5:
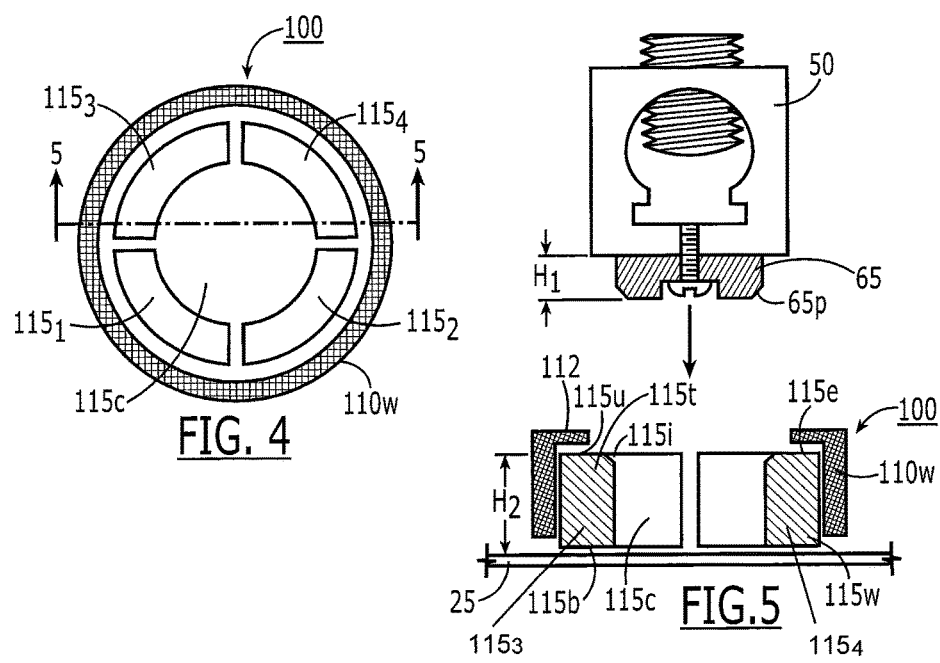
FIG. 4 is a top schematic illustration of the thermally conductive assembly shown in FIG. 3.
FIG. 5 is an exploded view of a section view of the thermally conductive assembly taken along line 5-5 in FIG. 4 aligned with a cable/electrical cord lug or collar connector and thermally and electrically conductive (typically copper) plug according to embodiments of the present invention.
Figure 7:
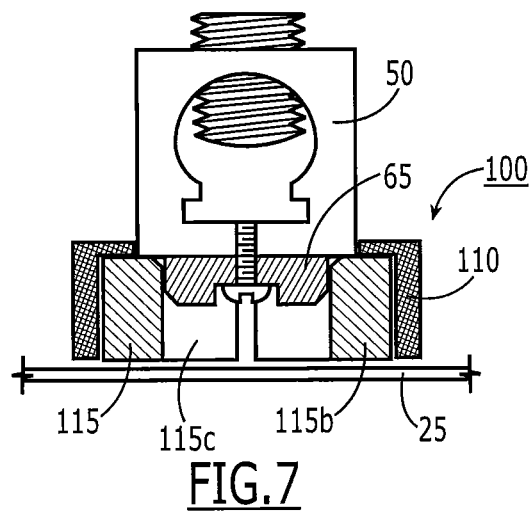
FIG. 7 is an assembled view of the components shown in FIG. 5 according to embodiments of the present invention.

As shown in FIG. 3, the at least one inner member 115 has an open channel 115c with a diameter $D_1$ that is sized and configured to receive the conductive member 65 such as plug 65p. The bottom of the at least one inner member 115 can contact the back pan 25 (FIGS. 5, 7).

The at least one inner member 115 can be thermally conductive and heat resistant. The term "heat resistant" means that the device can withstand normal operating temperatures of the device for which it is used without undue deterioration so as to be able to function as a heat transfer component and provide the desired constant contact interface. For use with circuit breakers and/or load centers, the term "heat resistant" refers to temperatures of 65 degrees Celsius without undue deterioration so as to be able to function as a heat transfer component, retain its shape and provide the desired constant contact interface.

The term "thermally conductive" and derivatives thereof with respect to the at least one inner member 115 means that it can conduct heat at a suitable level. In some embodiments, the thermal conductivity is in a range of between about 40%-80% of that same shaped and sized element if made of copper or aluminum measured at 20 degrees Celsius. The thermal conductivity of the at least one inner member 115 can be above 50 W/m-K*(e.g., W/m, ° K) and typically below 205 W/m-K*, in some embodiments, while being electrically resistive/electrically insulating. The at least one inner member 115 can have a thermal conductivity between about 100 to about 121 W/m-K* (compared to aluminum which is 205 W/m-K* or copper which is higher at 385 W/m-K*) and can also be electrically resistive.

With respect to the inner and/or outer members 110, 115, the term "electrically resistive" and derivatives thereof refers to the parameter ρ (Ω·m) at 20° C. and is used interchangeably with "electrically insulating" and means that the material/device conducts electricity at a value that is at least less than 50%, typically less than 75%, than that of the cooperating member 65 in the channel 115c of the at least one inner member 115. The inner and outer members 110, 115 can have an electrical resistivity similar to wood or rubber, i.e., at least about $1 \times 10^3$ or about $1\text{-}100 \times 10^{13}$ or greater.

As also shown in FIG. 5, the top or first end portion 115t can have a wall 115w that tapers axially inward from a flat portion 115u which can be associated with a maximal width at a top outer surface edge 115e to an interior segment 115i that forms an inner top surface of the interior channel 115c. The flat upper surface 115u can extend to an outer corner or edge 115e and can align with the collar 50 with a lip 112 of the outer member 110 therebetween.

The outer member 110 can abut an outer surface of the wall 115w of the one or more inner members 115. The conductive member 65 such as plug 65p can frictionally engage and/or be press fit into the channel 115c and the at least one member 115 can expand in response to the press fit of the conductive member 65 such as the plug 65p while the outer member 110 holds the members and applies a radially inwardly extending compression force.

The at least one inner member 115 can have a wall 115w with a greater thickness than the wall thickness of the outer member 110w. The outer member 110 can have reduced thermal conductivity and/or reduced electrical conductivity relative to the at least one inner member 115.

The outer member 110 can have a height $H_2$ that is greater than a height $H_1$ of the conductive member 65 and/or plug 65p (FIG. 5). The at least one inner member 115 can have a height that is the same or greater than the height of the outer member 110. When assembled, the plug 65p can reside inside the channel 115c a distance between 0.1 inches to about 1 inch above the bottom 115b of the at least one inner member 115 and above the back pan 25 a distance.

The outer member 110 can have a constant height about its perimeter or may vary to have longer and shorter sections, for example.

The at least one inner member 115 can be in shaped solid blocks of material that is heat resistant, has high thermal conductivity and electrical resistivity. The at least one inner member 115 can have a height that is between 0.1-1 inch, in some embodiments. An exemplary material is boron nitride. Boron nitride has high thermal conductivity and good electrical insulation. Other suitable, thermally conductive materials may be used for the at least one inner member 115. Where more than one inner member 115 is used, they can comprise the same or different materials.

The outer member 110 can be flexible to be able to expand radially to compress and hold the at least one inner member 115. The outer member 110 can comprise a rubber, polymer or elastomer and/or a shape memory metal.

The outer member 110 can have an interior channel 110i that has a diameter $D_2$, with $D_2 > D_1$ when assembled. In some embodiments, when unassembled and held in a non-expanded state, the diameter $D_2$ may be the same as $D_1$, but is typically less than $D_1$ by at least 10%, typically between 10-30%. The diameter $D_1$ can correspond to the outer diameter of the conductive member 65 such as the plug 65p. The diameter $D_1$ can be between about 0.1 inches to about 0.75 inches.

The channel 115c can have a diameter $D_1$ that can increase, typically by between 1% to about 10%, in response to press-fit receipt of the plug 65p so that the outer wall 65w of the plug 65p has a positive contact with the at least one inner member 115 and the bottom 115b at least one inner member 115 has a positive, constant contact with the back pan 25 once assembled with the circuit breaker 35 tightened to hold the cable 135 in the collar 50. The bottom 115b of the at least one inner member 115b is parallel to the primary surface of the back pan 25.

As shown in FIGS. 5 and 7, for example, the outer member 110 can have a radially inwardly extending lip 112 that extends a distance over a first end of the at least one inner member 115 (the end facing the plug 65). As shown in FIG. 7, when assembled, the collar 50 can reside above the channel 115c and can compress or crush the lip 112 down toward the back pan 25. The lip 112 can act as a spring that can apply a constant or substantially constant downward pressure between the bottom surface 115b of the at least one inner member 115 and the metal back pan 25. The outer member 110 can apply and maintain a force or pressure against the at least one inner member 115 and the plug 65 as the main breaker 35 is tightened during installation/assembly. The outer member 110 can concurrently push radially inward against the outer surface of the at least one inner member 115 and push downward against the top 115t of the at least one inner member 115 thereby pushing the at least one inner member 115 toward the back pan 25 for optimum or increased thermal conductivity.

The outer member 110 can be a single outer member as shown or may be provided as a plurality of concentric outer members of the same or different materials with the same or different wall thicknesses (not shown) configured to apply a desired inwardly and or downwardly extending force against the at least one inner member 115.

Figure 8:
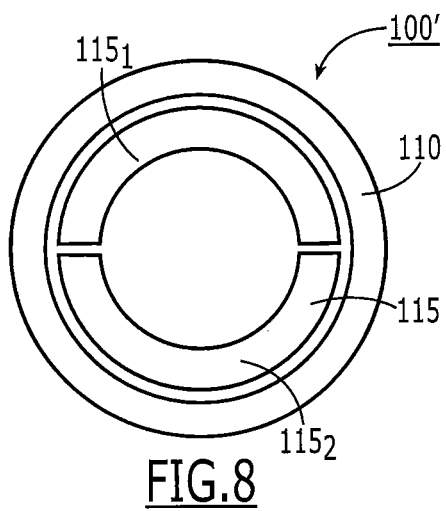
FIG. 8 is a top schematic illustration of another embodiment of the assembly according to embodiments of the present invention.
Figure 9:
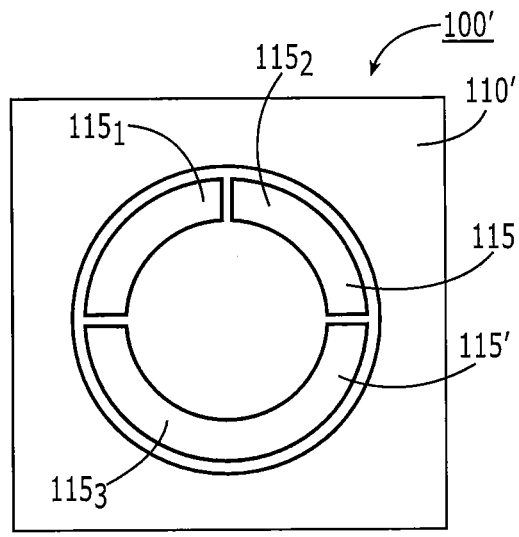
FIG. 9 is a top schematic illustration of yet another embodiment of the thermally conductive assembly according to embodiments of the present invention.

The at least one inner member 115 is typically a plurality of cooperating members, shown in FIG. 4 as four arcuate members $115_1$-$115_4$, shown in FIG. 8 as two cooperating members $115_1$, $115_2$, and shown in FIG. 9 as three arcuate cooperating members $115_1$-$115_3$, one having a greater circumferential extent than the others. The cooperating inner members 115 can form a circular outer perimeter and typically (but optionally) a circular inner perimeter, when held by the outer member 110.

Figure 6:
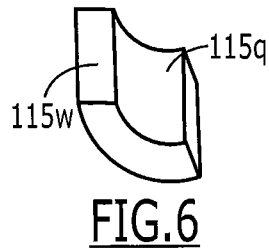
FIG. 6 is an enlarged view of an exemplary assembly inner member according to embodiments of the present invention.

FIG. 6 illustrates that the at least one inner member 115 can be ring quarters 115q that have a circumferential extent of about 90 degrees.

The plurality of inner members 115 can be discrete members that are detached or detachable from each other.

The at least one inner member 115 can be a single member that can have preferentially scored, thinner or weaker regions that can bend, fold, compress or yield to allow neighboring larger end segments to abut each other when held in the outer member 110.

Figure 10A:
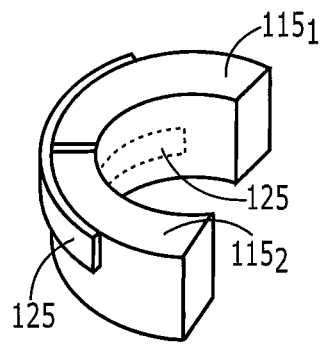
FIGS. 10A and 10B are side perspective views of exemplary thermally conductive inner members comprising a circumferentially extending tether according to embodiments of the present invention.
Figure 10B:
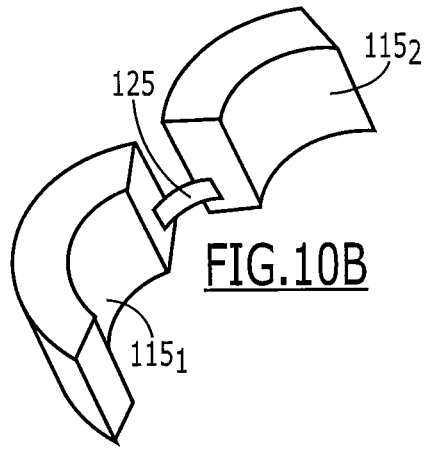

FIGS. 10A and 10B illustrate that at least one circumferentially extending tether 125 can be used to help retain the members $115_1$, $115_2$ in alignment. The at least one tether 125 can be a single tether or may be a plurality of different tethers. The at least one tether 125 can be on the outer or inner perimeter (FIG. 10A) or may laterally extend between the inner and outer perimeters (FIG. 10B) and be able to compress (fold or bend) to allow the members $115_1$, $115_2$ to move closer together and abut when compressed and travel apart but remain attached together without the outer member 110.

The outer member 110 can have a ring shape as shown in FIG. 4. The outer member 110' can have a non-circular outer perimeter shape as shown in FIG. 9. The outer member 110 can be a single monolithic member.

Figure 11:
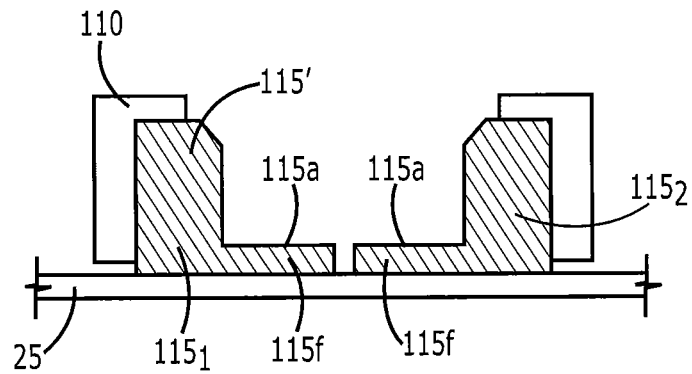
FIG. 11 is a section view of another embodiment of a thermally conductive assembly according to embodiments of the present invention.

The at least one inner member 115 has an open center channel 115c for at least a partial distance of the wall (open in a direction facing the plug 65). The channel 115c can be open through the entire length of the at least one inner member 115 (FIG. 5) or the at least one inner member 115 can have inwardly extending segment 115i that forms a partially or totally closed bottom floor 115f as shown in FIG. 11.

Figure 12A:
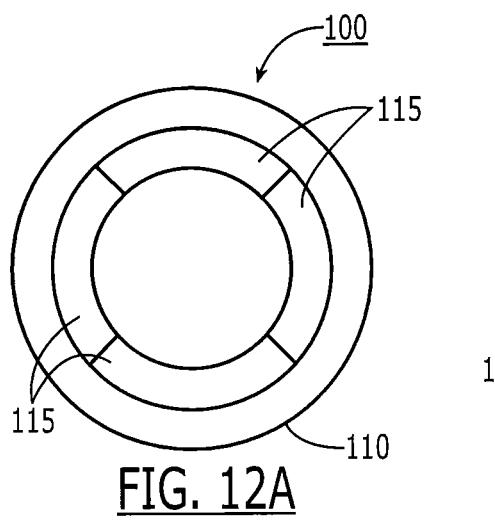
FIG. 12A is an end view of a thermally conductive assembly in a first assembled configuration according to embodiments of the present invention.
Figure 12B:
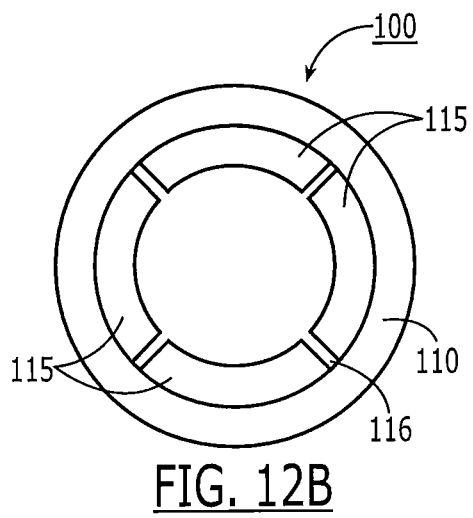
FIG. 12B illustrates the assembly of FIG. 12A in a post-installation configuration according to embodiments of the present invention.

As shown in FIG. 12A, prior to installation to an end unit or device, the thermally conductive assembly 100 can hold the plurality of inner members 115n (where "n" is typically between 2-12, more typically between 2-4), so that adjacent facing surfaces of neighboring inner members abut each other inside the outer member 110. When assembled, as shown in FIG. 12B, the inner members 115 can be forced radially outward expanding the outer member and forming separation spaces or gaps 116 between neighboring adjacent surfaces in response to receipt of a thermally conductive member such as a metallic plug or other shaped device.

The at least one inner member 115 is typically a plurality of circumferentially spaced apart cooperating members. Sidewalls of the inner members 115 can optionally include slidingly engageable configurations, i.e., slots and protrusions (not shown), that can facilitate alignment for assembly as a sub-assembly unit (FIG. 12A) while allowing retained separation during installation (FIG. 12B).

It is also noted that the thermally conductive assembly 100, 100' may be useful for other devices where a heat conduction path is desired, including, by way of example, from conductors inside circuit breakers and/or for Motor Control Centers or buckets thereof, motor starters or feeders, switchgears and the like. See, e.g., U.S. Pat. No. 4,024,441, U.S. Patent Application Publication Serial Number US2013/0077210, U.S. Pat. Nos. 6,194,983 and 7,186,933, the contents of which are hereby incorporated by reference as if recited in full herein.

Figure 13:
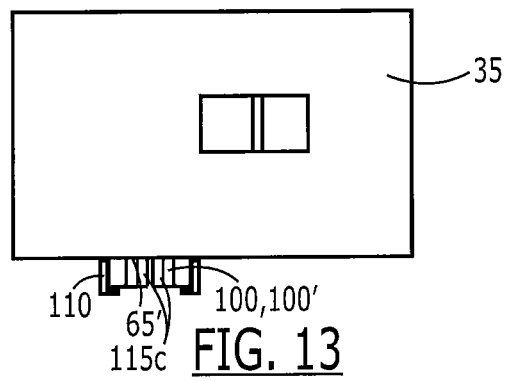
FIG. 13 is a schematic illustration of a thermally conductive assembly used for heat conduction on circuit breakers at other locations from that shown in FIG. 3, for example, according to embodiments of the present invention.

It is further noted, that the thermally conductive assembly 100, 100' can be configured to cooperate with other conductive members to facilitate heat conduction and is not limited to plugs or collars. Further, as shown in FIG. 13, other electrically conductive members 65' can extend from a circuit breaker 35 at other positions (shown as a sidewall) and is not limited to the plug 65p nor a particular location on a circuit breaker 35, nor limited to use with a collar 50 shown in some embodiments.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed is:

1. A thermally conductive assembly comprising:
   at least one inner member with longitudinally opposing first and second ends and an open channel extending between the first and second ends, wherein the at least one inner member is thermally conductive; and
   an outer member surrounding the at least one inner member, wherein the outer member is sufficiently flexible to expand outward in response to an outward force applied by the at least one inner member,
   wherein the outer member includes a lip that resides over the first end of the at least one inner member,
   wherein the outer member is a flexible ring,
   wherein the at least one inner member is a plurality of inner members, each with a wall thickness greater than a wall thickness of the outer member, and
   wherein the outer member can radially expand to allow the inner members to move from a first configuration where neighboring inner members abut to a second configuration where neighboring inner members are spaced apart while the outer member provides a compressive inwardly extending force against the inner members.

2. The assembly of claim 1, wherein the inner members have inner surfaces that align to form an inner perimeter surrounding the open channel.

3. The assembly of claim 1, wherein the inner members are arcuate, and wherein the open channel is an open circular center channel formed by inner surfaces of the inner members.

4. The assembly of claim 1, wherein the outer member is a ring that is radially expandable and comprises one or more of rubber, a polymer and/or an elastomer.

5. The assembly of claim 1, wherein the inner members comprise boron nitride.

6. The assembly of claim 1, wherein the inner members have inner and outer arcuate shapes that form a circular inner perimeter surrounding the open channel and a circular outer perimeter abutting the outer member.

7. The assembly of claim 1, wherein the inner members are thermally conductive and heat resistant, wherein heat resistant means that, in use, the inner members can withstand normal operating temperatures without undue deterioration so as to be able to function as a heat transfer component and provide a desired constant contact interface with a target device.

8. The assembly of claim 7, wherein the assembly is configured for use with circuit breakers and/or load centers with operating temperatures of 65 degrees Celsius with the inner member able to function as a heat transfer component and provide the desired constant contact interface.

9. The assembly of claim 1, wherein the inner members have a thermal conductivity in a range of between about 40%-80% of that same shaped and sized element if made of copper or aluminum measured at 20 degrees Celsius.

10. The assembly of claim 1, wherein the inner members have a thermal conductivity above 50 W/m-K* and below about 205 W/m-K* while being electrically resistive/electrically insulating.

11. The assembly of claim 1, wherein the inner members have a thermal conductivity in a range of about 100 to about 121 W/m-K*.

12. The assembly of claim 1, wherein the inner members and/or the outer member is electrically resistive $\rho$ ($\Omega \cdot m$) at 20° C. with an electrical resistivity of at least about $1 \times 10^3$ or about $1\text{-}100 \times 10^{13}$ or greater.

13. The assembly of claim 1, wherein the outer member has reduced thermal conductivity and/or reduced electrical conductivity relative to the inner members.

* * * * *